United States Patent
Klass et al.

(10) Patent No.: US 6,828,852 B2
(45) Date of Patent: Dec. 7, 2004

(54) ACTIVE PULSED SCHEME FOR DRIVING LONG INTERCONNECTS

(75) Inventors: Edgardo F. Klass, Palo Alto, CA (US); Andrew J. Demas, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 170 days.

(21) Appl. No.: 10/218,531

(22) Filed: Aug. 13, 2002

(65) Prior Publication Data

US 2004/0032002 A1 Feb. 19, 2004

(51) Int. Cl.$^7$ ................................................ H01L 25/00
(52) U.S. Cl. .................. 327/564; 327/299; 327/551; 326/26; 326/47; 326/101
(58) Field of Search ................ 327/564, 565, 327/299, 551; 326/15, 26, 47, 101; 375/296

(56) References Cited

U.S. PATENT DOCUMENTS

| | | | | |
|---|---|---|---|---|
| 5,309,015 A | * | 5/1994 | Kuwata et al. ............. 257/659 |
| 6,262,614 B1 | * | 7/2001 | Sasaki ........................ 327/198 |
| 6,586,981 B2 | * | 7/2003 | Shibuya ...................... 327/203 |
| 6,708,314 B2 | * | 3/2004 | Trivedi et al. ................. 716/2 |
| 2002/0008546 A1 | * | 1/2002 | Tanaka ........................ 326/101 |

* cited by examiner

*Primary Examiner*—Quan Tra
(74) *Attorney, Agent, or Firm*—Gunnison, McKay & Hodgson, L.L.P.; Forrest Gunnison

(57) ABSTRACT

An interconnect structure includes a signal wire and an active shield line adjacent to, but removed from, the signal wire. The interconnect structure also includes another active shield line adjacent to, but removed from, the signal wire. A signal driver is connected to the signal wire. The signal driver drives a pulse on the signal wire. A shield driver is connected to the active shield line. The shield driver asserts a signal on the active shield line substantially simultaneous with the pulse. Another shield driver is connected to the another active shield line. The another shield driver asserts a signal on the another active shield line substantially simultaneous with the pulse. The effect of the simultaneous signals on the signal wire and the active shield lines is to effectively cancel the lateral capacitances between these lines.

4 Claims, 3 Drawing Sheets

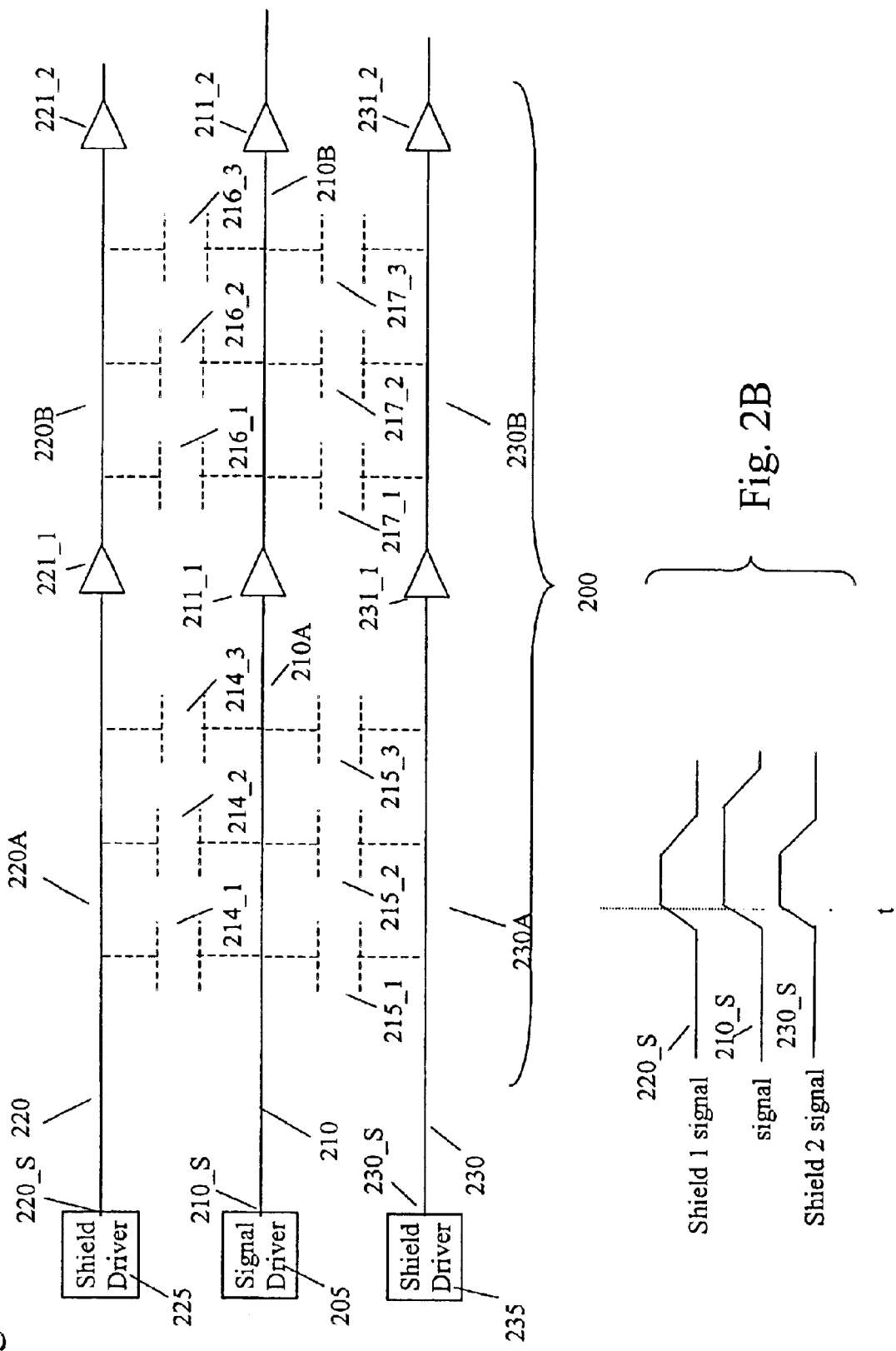

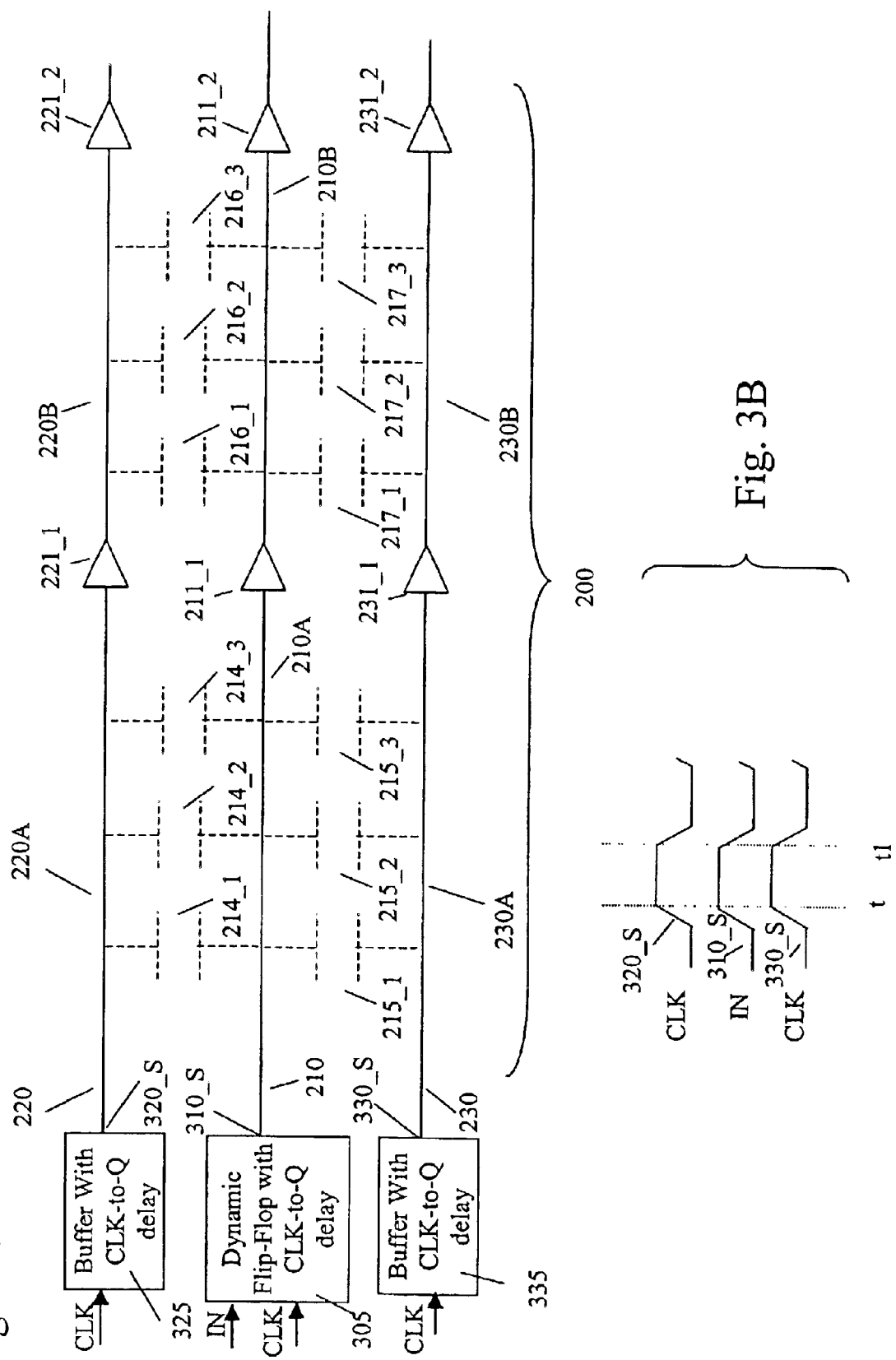

US 6,828,852 B2

ACTIVE PULSED SCHEME FOR DRIVING LONG INTERCONNECTS

BACKGROUND OF THE INVENTION

1. Field of the Invention

The present invention relates generally to interconnect structures, and more particularly to methods for reducing interconnect structure signal delays.

2. Description of Related Art

At current levels of chip integration, interconnect signal delay has become a substantial factor in chip speed. If an interconnect structure has a signal wire running parallel to other signal wires for a relatively long distance, the effective capacitance of the signal wire that is seen by the driver of that wire depends on the signal switching activities on the neighboring signal wires.

If a signal wire is situated between two other signal wires and signals on the two other signal wires switch in one direction nearly simultaneously with a signal switch on the middle signal wire in the opposite direction, the effective capacitance seen by the driver of the middle signal wire is doubled. Conversely, if the signals on the two other signal wires switch simultaneously with a signal switch on the middle signal wire in the same direction, the effective capacitance seen by the driver of the middle signal wire is zero.

This phenomenon is referred to in the literature as the Miller effect. In current submicron technologies where most of the capacitance of a wire is to adjacent neighboring wires, the Miller effect results in a worst-case signal delay on the wire, to a first order, which is twice the signal delay when signals on the neighboring wires are quiet.

FIG. 1 is an illustration of a common method used in submicron technologies to negate the Miller effect in interconnects. Wire 110 is a signal wire that is part of a long interconnect and so includes three buffers 111_1 to 111_3. The segment of wire 110 between each of buffers 111_1 to 111_3 is shielded.

Specifically, segment 110A of wire 110 between buffers 111_1 and 111_2 is shielded by wires 112_1 and 112_2. Segment 110B of wire 110 between buffers 111_2 and 111_3 is shielded by wires 113_1 and 113_2.

The capacitance between segment 110A and wire 112_1 is represented by capacitors 114_1 to 114_3. The capacitance between segment 110A and wire 112_2 is represented by capacitors 115_1 to 115_3.

The capacitance between segment 110B and wire 113_1 is represented by capacitors 116_1 to 116_3. The capacitance between segment 110B and wire 113_2 is represented by capacitors 117_1 to 117_3.

To prevent the increase in the effective capacitance due to the Miller effect, each end of a shield wire is tied to the power supply ground as illustrated in FIG. 1. Hence, the shields provided by wires 112_1, 112_2 and 113_1, 113_2 are guaranteed not to switch signal state. Consequently, the effective capacitances seen by the driver of the signal wire was constant, independent to a first order of signal switching activities on neighboring wires.

Various techniques have been used to provide grounded shield for signal wires in an interconnect structure. See for example, U.S. Pat. No. 6,081,022 entitled "Clock Distribution Network with Efficient Shielding," of Sundari S. Mitra et al. issued on Jun. 27, 2000.

SUMMARY OF THE INVENTION

In one embodiment of the present invention, an interconnect structure includes a signal wire and an active shield line adjacent to, but removed from, the signal wire. A signal, which is substantially simultaneous to a pulse on the signal wire, is asserted on the active shield line.

The interconnect structure also includes another active shield line adjacent to, but removed from, the signal wire. A signal driver is connected to the signal wire. The signal driver drives the pulse on the signal wire. A shield driver is connected to the active shield line. The shield driver asserts the signal on the active shield line substantially simultaneous with the pulse. Another shield driver is connected to the another active shield line. The another shield driver asserts a signal on the another active shield line substantially simultaneous with the pulse.

The effect of the simultaneous signals on the signal wire and the active shield lines is to effectively cancel any lateral capacitances between these lines. This reduces the total capacitance seen by the signal driver and therefore significantly reduces the signal delay of the signal wire.

Hence, in one embodiment of this invention, a method for reducing lateral capacitance in an interconnect structure includes:

driving a pulse on a signal wire; and asserting a signal substantially simultaneous with the pulse on an active shield line of the interconnect structure where the active shield line is adjacent to, but removed from, the signal wire.

The active shields can be used in a wide variety of applications where the Miller effect is a problem. For example, the active shields can be used at the board level, the integrated circuit level, or the on-chip level. The active shields are particularly advantageous for a submicron on-chip interconnect structure where the lateral capacitance makes up a substantial component of the total capacitance associated with a signal line in the interconnect structure.

BRIEF DESCRIPTION OF THE DRAWINGS

FIG. 2A is an illustration of an interconnect structure that utilizes active shield lines according to one embodiment of the present invention.

FIG. 2B is an illustration one embodiment of signal traces that are driven on the active shield lines and the signal wire of FIG. 2A to eliminate the lateral capacitance effects.

FIG. 3A is an illustration of an interconnect structure for a submicron technology integrated circuit that utilizes active shield lines and a dynamic flip-flop as the signal wire driver according to one embodiment of the present invention.

FIG. 3B is an illustration one embodiment of signal traces that are driven on the active shield lines and the signal wire of FIG. 3A to eliminate the lateral capacitance effects.

In the drawings and the following detailed description, elements with the same reference numeral are the same or equivalent elements. Also, the first digit of a reference numeral is the figure number of the figure in which the element having that reference numeral first appears.

DETAILED DESCRIPTION

Figure 1:
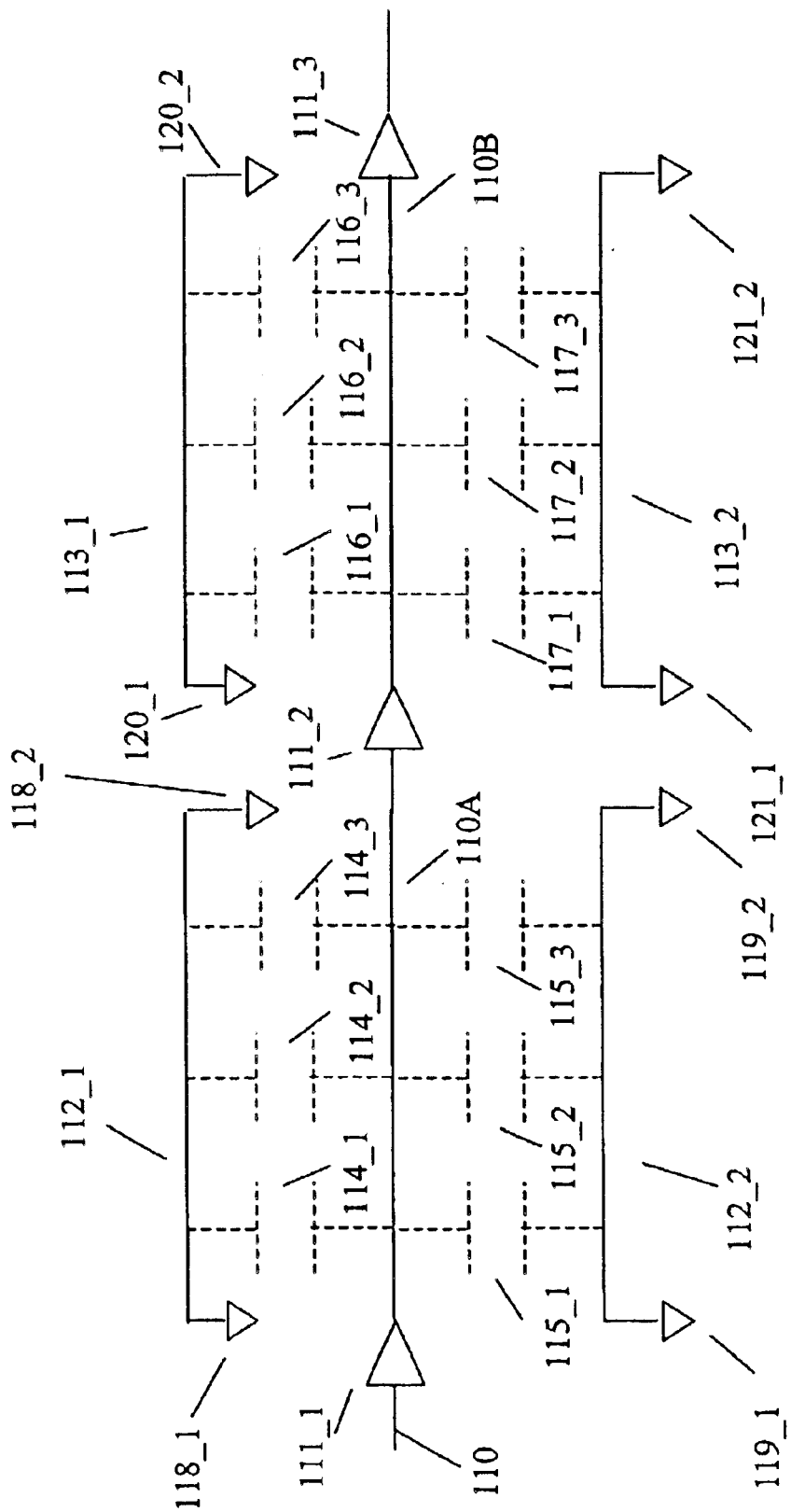
FIG. 1 is an illustration of a prior art interconnect structure that utilized grounded shields to minimize lateral capacitance effects and in particular the Miller effect.

The prior art limitations of shielding a signal wire 210 (FIG. 2A) to minimize capacitive interconnect signal delays are overcome by using an active shield, e.g., active shield line 220, according to one embodiment of the present invention. Active shield line 220 is driven with a shield signal 220_S that switches state simultaneously with a signal 210_S on signal wire 210 such that shield signal 220_S and signal 210_S are substantially in synchronization, as explained more completely below. This assures that adverse lateral capacitive effects associated with the Miller effect are minimized, which in turn minimizes signal delay associated with the interconnect structure.

The active shields permit a higher density interconnect than in the prior art while maintaining at least the same performance level as the prior art structure. If the same line spacing is maintained in the interconnect structure as in the prior art, better signal performance is obtained with the active shields. The active shields are applicable at any level where the Miller effect is a problem, for example, at a board level, at a chip level, or at an on-chip level.

FIG. 2A is an illustration of a portion 200 of an interconnect structure that includes a long interconnect signal wire 210 that is positioned between two active shield lines 220 and 230, i.e., each active shield line is adjacent to, but removed from, signal wire 210. Signal wire 210 has a segment 210A between signal driver 205, which typically is, or is part of, a buffer, and buffer 211_1 and another segment 210B between buffers 211_1 and 211_2.

Each of active shield lines 220 and 230 has a structure equivalent to the structure of signal wire 210. Specifically, segment 220A of active shield line 220, which is between shield driver 225 and buffer 221_1, and segment 230A of active shield line 230, which is between shield driver 235 and buffer 231_1, are equivalent to, and shield segment 210A of signal wire 210.

Similarly, segment 220B of active shield line 220, which is between buffers 221_1 and 221_2, and segment 230B of active shield line 230, which is between buffers 231_1 and 231_2, are equivalent to, and shield segment 210B of signal wire 210. While it is not shown in the drawings, each of active shield lines 220 and 230 is terminated with a dummy load that has line load characteristics equivalent to the line load at the end of signal wire 210.

The capacitance between signal wire segment 210A and active shield segment 220A, which in one embodiment is a lateral capacitance, is represented by capacitors 214_1 to 214_3. The capacitance between signal wire segment 210A and active shield segment 230A, which in the one embodiment is a lateral capacitance, is represented by capacitors 215_1 to 215_3.

The capacitance between signal wire segment 210B and active shield segment 220B, which in the one embodiment is a lateral capacitance, is represented by capacitors 216_1 to 216_3. The capacitance between signal wire segment 210B and active shield segment 230B, which in the one embodiment is a lateral capacitance, is represented by capacitors 217_1 to 217_3. As indicated above, signals are driven on shields 220 and 230 so that the effective capacitance seen by driver 205 on signal wire 210 is zero.

The number of segments in the interconnect structure of FIG. 2A is illustrative only and is not intended to limit the invention to the number of segments shown. One aspect is to maintain the equivalence between the segments of the shield and the signal wire so that extraneous capacitance effects are not introduced by differences in the layout of the interconnect structure.

As illustrated in FIG. 2A, a signal 210_S is driven on signal wire 210 by signal driver 205. Shield signal one 220_S is driven on active shield line 220 by shield driver 225 while shield signal two 230_S is driven on active shield line 230 by shield driver 235.

Signal driver 205 drives pulses on signal wire 210, in one embodiment. For example, as illustrated in FIG. 2B, signal 210_S is at a first level, e.g., zero volts so that line 210 is precharged to the first level. If the signal is to be asserted on wire 210 during a given clock cycle, signal driver 205 drives signal 210_S to a second level, e.g., high, and after a certain time resets signal 210_S to the first level. Signal driver 205 has a characteristic time delay Tdelay for an input signal to pass through signal driver 205 and reach signal wire 210.

Shield drivers 225 and 235 are configured so that signals 220_S and 230_S, respectively, have a predetermined relationship with signal 210_S. Both of shield drivers 225 and 235 have characteristic time delay Tdelay so that an input signal reaches the active shield line after time Tdelay.

Hence, as illustrated in FIG. 2B, signals 220_S and 230_S are aligned with signal 210_S so that the rising transitions are approximately simultaneous, e.g., at time t, the signals are all at approximately full on. This effectively cancels the lateral capacitance loading on driver 205, which in submicron technologies is the dominant element in the total capacitance seen by signal driver 205. Hence, as used herein, a submicron technology is one in which the lateral capacitance of an interconnect is the dominant component of the total capacitance of that interconnect.

To minimize the capacitance, the input signals to drivers 220 and 230 are correlated with the input signal to driver 210 and since each driver has about the same time delay, e.g., the same time delay to within manufacturing and design tolerances, the active shield lines are pulsed at the same time that a pulse appears on the signal wire. However, if the falling transition of the signal on the signal wire does not affect performance, it not necessary that the pulses have the same time duration, i.e., width, and so the falling transitions need not be aligned. Conversely, if the falling transitions can affect performance, each edge, either rising or falling, of signal 210_S is driven on signal wire 210_S substantially simultaneously with an edge of signal 220_S and an edge of signal 230_S on active shield lines 220 and 230, respectively.

FIG. 3A illustrates an embodiment of this invention that utilizes a dynamic flip-flop 305 as signal driver 205 (FIG. 2A). Dynamic flip-flops suitable for use in this invention are described, for example, in U.S. Pat. No. 5,920,218, entitled "Single Phase Edge-Triggered Dual-Rail Dynamic Flip-flop," of Edgardo F. Klass, et al.; U.S. Pat. No. 5,825,244, entitled "Edge-Triggered Dual-Rail Dynamic Flip-Flop With Self-Shut-Off Mechanism," of Edgardo F. Klass, et al.; U.S. Pat. No. 6,121,807, entitled "Single Phase Edge-Triggered Dual-Rail Dynamic Flip-flop," of Edgardo F. Klass, et al.; and U.S. Pat. No. 6,222,404 B1, entitled "Edge-Triggered Dual-Rail Dynamic Flip-Flop With An Enhanced Self-Shut-Off Mechanism," of Anup S. Mehta, et al., each of which is incorporated herein by reference in its entirety.

Dynamic flip-flop 305 receives an input signal IN and a clock signal CLK. When clock signal CLK to dynamic flip-flop 305 transitions to a high level, if input signal IN to dynamic flip-flop 305 is also at a high level, the output signal from dynamic flip flop 305 on line 210 transitions to a high level after a time delay that is characteristic of dynamic flip flop 305. Characteristic time delay Tdelay for dynamic flip-flop 305 is the time from a clock signal CLK transition until the time when the input signal reaches the output terminal of dynamic flip-flop 305, and is called the clock-to-Q delay.

In this embodiment, shield drivers 225 and 235 are each a buffer 325, 335 that receives clock signal CLK as an input signal. The time delay of each buffer is approximately the clock-to-Q delay of dynamic flip-flop 305.

In one embodiment, dynamic flip-flop 305, as signal driver 205, precharges signal wire 210 to a low level. If input signal IN to dynamic flip-flop 305 remains low, the output signal from dynamic flip-flop 305 remains low. In this case, the signals from buffers 325 and 335 may introduce noise on signal wire 210 when the signal is at a low level. If noise is an issue, wire 210 is spaced relative to active shields 220 and 230 so that any noise induced on signal wire 210 by signals on active shields 220 and 230 when the signal from dynamic flip-flop 305 remains low is less than the noise level permitted on signal wire 210 for a low signal level.

When dynamic flip-flop 305 precharges signal wire 210 to a low level, and clock signal CLK transitions, if input signal IN to dynamic flip-flop 305 is also at a high level, output signal 301_S from dynamic flip flop 305 transitions to a high level after the clock-to-Q delay.

Since buffers 325 and 335 receive clock signal CLK and have the clock-to-Q delay from the input terminal to the output terminal, high output signals are driven on active shield lines 220 and 230 at the same time as a high signal is driven on signal wire 210 by dynamic flip-flop 305. Consequently, the substantially simultaneous signal traces as shown in FIG. 3B are obtained on lines 220, 210, and 230, respectively.

As noted above, the effect of these signals is to effectively cancel the capacitances illustrated in FIG. 3A. This reduces the total capacitance seen by signal driver 205 and therefore significantly reduces the signal delay of signal wire 210. If no information is conveyed by the falling transitions and the falling transitions do not affect performance, the falling transitions need not be aligned and so the timing of these transitions is not critical.

FIGS. 2A and 3A illustrate interconnect structures that include means for driving a pulse on a signal wire, and means for asserting a signal substantially simultaneous with the pulse on an active shield line of the interconnect structure where the active shield line is adjacent to, but removed from, the signal wire. These structures also include means for asserting a signal substantially simultaneous with the pulse on another active shield line of the interconnect structure where the another active shield line is adjacent to, but removed from, the signal wire.

The embodiments described above are illustrative only and are not intended to limit the invention to the specific embodiments described. In view of this disclosure, those of skill in art can implement the active shields in a variety of interconnect configurations so as to minimize the lateral capacitance and in particular, the lateral capacitance of interconnect structures in integrated circuits built using submicron technology.

We claim:

1. An integrated circuit structure comprising:

a signal wire;

a first active shield line adjacent to, but removed from, said signal wire;

a second active shield line adjacent to, but removed from, said signal wire a dynamic flip-flop having an output terminal connected to said signal wire wherein said dynamic flip-flop drives a pulse on said signal wire and said dynamic flip-flop has a clock-to-Q time delay characteristic;

a first buffer having an output terminal connected to said first active shield line and an input terminal connected to a clock line wherein said first buffer has about said clock-to-Q time delay characteristic so that said first buffer asserts a signal on said first active shield line substantially simultaneous with said pulse; and a second buffer having an output terminal connected to said second active shield line and an input terminal connected to said clock line wherein said second buffer has about said clock-to-Q time delay characteristic so that said second buffer asserts a signal on said second active shield line substantially simultaneous with said pulse.

2. The structure of claim 1, wherein said structure is implemented using a submicron technology.

3. A method for reducing capacitance in an interconnect structure comprising:

precharging a signal wire in said interconnect structure to a first level;

driving a pulse on said signal wire by a dynamic flip flop having a clock-to-Q time delay characteristic; and asserting a signal substantially simultaneous with said pulse on a first active shield line of said interconnect structure by a first buffer having an output terminal connected to said first active shield line, and an input terminal connected to a clock line wherein said first buffer has about said clock-to-Q time delay characteristic and further wherein said first active shield line is adjacent to, but removed from, said signal wire, asserting a signal substantially simultaneous with said pulse on a second active shield line of said interconnect structure by a second buffer having an output terminal connected to said second active shield line and an input terminal connected to said clock line wherein said second buffer has about said clock-to-Q time delay characteristic and further wherein said second active shield line is adjacent to, but removed from, said signal wire.

4. An interconnect structure comprising:

dynamic flip-flop means for driving a pulse on a signal wire wherein said means for driving has a clock-to-Q time delay characteristic; and first means for asserting a signal substantially simultaneous with said pulse on a first active shield line of said interconnect structure wherein said first means includes an output terminal connected to said first active shield line and an input terminal connected to a clock line wherein said first means has about said clock-to-Q time delay characteristic and further wherein said first active shield line is adjacent to, but removed from, said signal wire; and second means for asserting a signal substantially simultaneous with said pulse on a second active shield line of said interconnect structure wherein said second means includes an output terminal connected to said second active shield line and an input terminal connected to said clock line wherein said second means has about said clock-to-Q time delay characteristic and further wherein said second active shield line is adjacent to, but removed from, said signal wire.

* * * * *